(12) United States Patent
Blennerhassett et al.

(10) Patent No.: US 10,290,532 B2
(45) Date of Patent: May 14, 2019

(54) FORMING AN ISOLATION BARRIER IN AN ISOLATOR

(71) Applicant: Analog Devices Global, Hamilton (BM)

(72) Inventors: Alan John Blennerhassett, Kerry (IE); Bernard Patrick Stenson, Limerick (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/600,664

(22) Filed: May 19, 2017

(65) Prior Publication Data

US 2018/0337084 A1    Nov. 22, 2018

(51) Int. Cl.
*H01L 21/76* (2006.01)
*H01L 21/768* (2006.01)
(Continued)

(52) U.S. Cl.
CPC ............ *H01L 21/76* (2013.01); *H01F 17/00* (2013.01); *H01L 21/768* (2013.01); *H01L 21/7682* (2013.01); *H01L 21/7687* (2013.01); *H01L 21/823481* (2013.01); *H01L 21/823878* (2013.01); *H01L 23/528* (2013.01); *H01L 23/5222* (2013.01); *H01L 23/5227* (2013.01); (Continued)

(58) Field of Classification Search
CPC . H01L 21/76; H01L 21/762; H01L 21/76245; H01L 21/76297; H01L 21/823481; H01L 21/823878; H01L 23/5221; H01L 23/5222; H01L 23/5223; H01L 23/5225; H01L 23/5227; H01L 23/528; H01L 23/5283; H01L 23/642; H01L 23/645; H01L 27/0248; H01L 27/0288; H01L 27/0292; H01L 27/0296; H01L 28/10; H01L 28/40
See application file for complete search history.

(56) References Cited

U.S. PATENT DOCUMENTS

| 7,947,600 B2 | 5/2011 | Iwaya et al. |
| 8,364,195 B2 | 1/2013 | Spina et al. |

(Continued)

OTHER PUBLICATIONS

U.S. Appl. No. 15/600,678, filed May 19, 2017, Blennerhassett.

*Primary Examiner* — Eduardo A Rodela
(74) *Attorney, Agent, or Firm* — Wolf, Greenfield & Sacks, P.C.

(57) ABSTRACT

Integrated digital isolators comprise a first transformer coil or capacitor plate mounted on an integrated circuit substrate, and separated from a second transformer coil or capacitor plate via an electrically insulating isolation layer. The electrical isolation that is achieved is dependent upon the material and thickness of the isolation layer. In order to reduce the amount of time required for fabrication while still allowing thick isolation layers to be deployed, in examples of the disclosure pre-formed sheets or tapes of dielectric material are applied to the substrate over the first transformer coil or capacitive plate, for example by being rolled onto the substrate using a heated roller. Such a technique results in a thick isolation layer that is formed using a simple process and much more quickly and reliably than conventional spin-coating or deposition techniques.

20 Claims, 10 Drawing Sheets

(51) Int. Cl.
*H01L 21/8238* (2006.01)
*H01L 23/522* (2006.01)
*H01L 23/528* (2006.01)
*H01L 21/8234* (2006.01)
*H01L 23/64* (2006.01)
*H01F 17/00* (2006.01)
*H01L 29/06* (2006.01)
*H01G 4/06* (2006.01)

(52) U.S. Cl.
CPC ............ *H01L 23/642* (2013.01); *H01G 4/06* (2013.01); *H01L 29/0649* (2013.01)

(56) References Cited

U.S. PATENT DOCUMENTS

| | | |
|---|---|---|
| 8,378,776 B1 | 2/2013 | Gabrys et al. |
| 8,427,844 B2 | 4/2013 | Ho et al. |
| 2004/0166659 A1 | 8/2004 | Lin et al. |
| 2004/0177811 A1* | 9/2004 | Kobayashi ........ H01L 21/67132 118/722 |
| 2005/0224978 A1* | 10/2005 | Kawate ............... H01L 21/6836 257/753 |
| 2008/0061631 A1 | 3/2008 | Fouquet et al. |
| 2009/0065590 A1* | 3/2009 | Aoki ................. G06K 19/07749 235/492 |
| 2009/0093088 A1* | 4/2009 | Ano ........................ H01L 21/56 438/114 |
| 2010/0096713 A1* | 4/2010 | Jung .................... B81C 1/0023 257/415 |
| 2014/0252533 A1 | 9/2014 | O'Sullivan |
| 2014/0346887 A1 | 11/2014 | Bhamidipati et al. |
| 2016/0035672 A1 | 2/2016 | Funaya et al. |
| 2016/0197066 A1* | 7/2016 | Uchida ................... H01L 28/10 438/3 |
| 2016/0204188 A1 | 7/2016 | Yamaji |
| 2016/0249453 A1* | 8/2016 | Tatami .................... B32B 9/007 |
| 2016/0322343 A1* | 11/2016 | Scanlan ................ H01L 21/565 |
| 2017/0373008 A1* | 12/2017 | Constantino .......... H01L 23/538 |

* cited by examiner

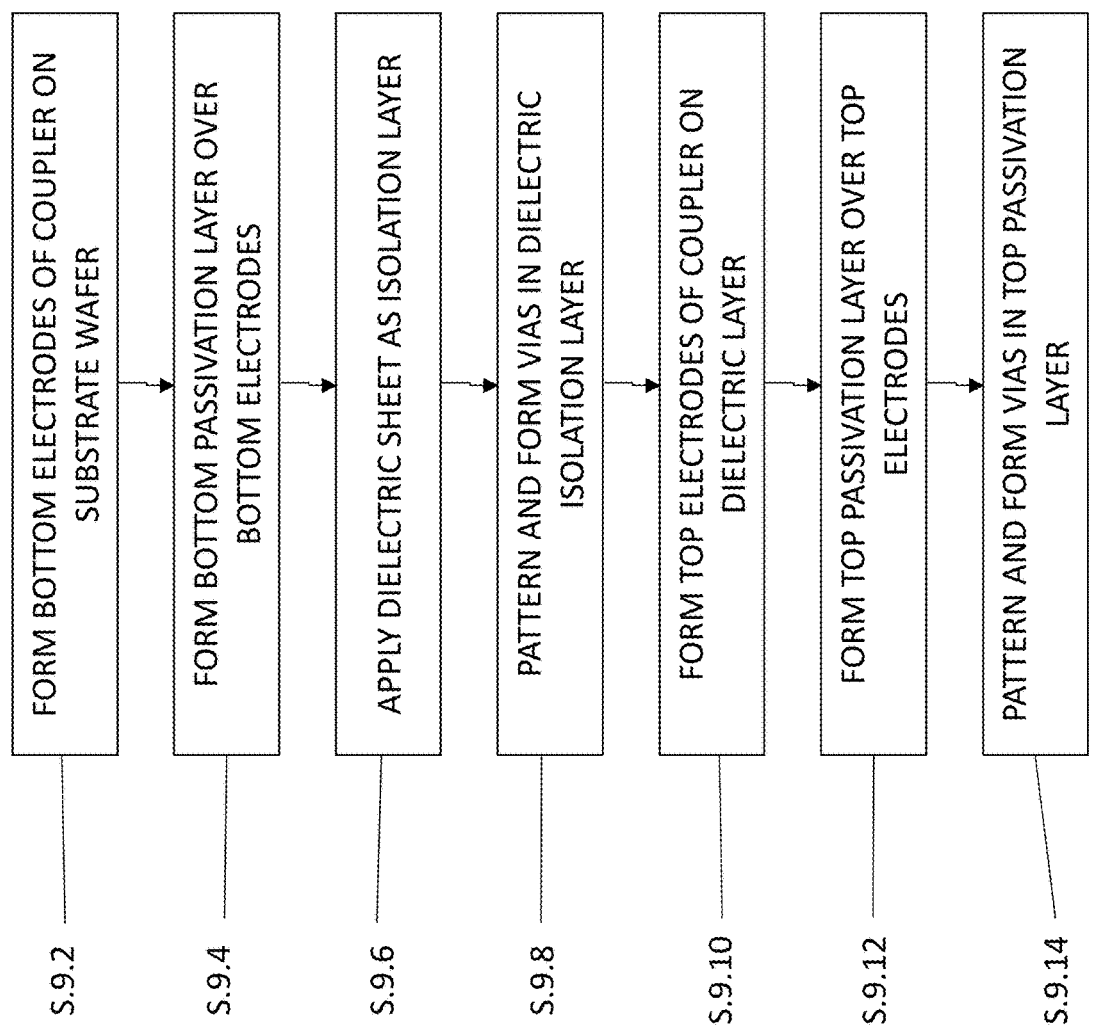

FORMING AN ISOLATION BARRIER IN AN ISOLATOR

FIELD OF THE DISCLOSURE

The present disclosure relates to a method of forming an isolation barrier in an isolator circuit, and a resulting isolator formed with the method.

BACKGROUND

Digital isolators use transformers or capacitors to magnetically or capacitively couple data across an isolation barrier. Transformers pulse current through a coil to create a small, localized magnetic field that induces current in another coil separated by the isolation barrier, whereas capacitors use low currents to create a coupling electric field across the isolation barrier separating respective capacitor plates. One of the performance parameters for a digital isolator is the isolation capability, which may be measured in terms of the 1 minute withstand voltage (i.e. the voltage that the isolation can withstand for 1 minute before isolation breakdown) or the surge level (i.e. a peak surge voltage that the isolation can withstand instantaneously). Generally, the thicker the isolation barrier can be, combined with a material of higher dielectric constant, the greater the isolation capability that will be obtained. Techniques to obtain thick barriers with high isolation properties are therefore of much use in the fabrication of digital isolators.

SUMMARY OF THE DISCLOSURE

In order to obtain thick isolation barriers within a reasonable fabrication time, therefore, in examples of the disclosure pre-formed sheets or tapes of dielectric material are applied to the substrate over the first transformer coil or capacitive plate, for example by being rolled onto the substrate using a heated roller, or being applied directly thereto in a vacuum environment to avoid air bubbles. Such a technique results in a thick isolation layer that is formed using a simple one-step process, and hence much more quickly and with lower outgassing risk than conventional spin-coating or deposition techniques to create isolation layers of the same thickness.

In view of the above, from one aspect the present disclosure provides a method of forming a dielectric insulation layer in an integrated isolator circuit, comprising receiving a partially formed integrated isolator circuit structure having a first electrode set formed on a substrate wafer, and applying a pre-formed dielectric sheet or tape over the partially formed integrated isolator circuit structure. Thereafter, a second electrode set is formed on the applied pre-formed dielectric sheet or tape, to give the isolator structure. The use of the flexible pre-formed dielectric sheet or tape replaces the need for multiple spin-coating and curing steps, or for time-intensive deposition of insulative layers.

In one example the dielectric sheet or tape is flexible and is rolled onto the partially formed integrated isolator structure from one side of the structure to the other. For example, the dielectric sheet or tape may be rolled onto the structure with the aid of a roller tool, such as a heated roller. Rolling the sheet or tape onto the isolator structure from side to side helps to ensure that no air bubbles are caught underneath the tape or sheet.

In another example the dielectric sheet or tape is simply placed onto the partially formed integrated isolator structure, within a vacuum environment. That is, the sheet or tape is placed over the whole of the partially formed integrated isolator structure by being lowered thereover in one step. Performing the operation in a vacuum environment should ensure that no air bubbles are trapped under the sheet. In this example, the sheet need not be flexible, and a degree of stiffness can aid the operation.

In one example the pre-formed dielectric sheet or tape is a polymer material, for example an organic polymer material. In this respect, in one example the pre-formed dielectric sheet or tape is a polyimide sheet or tape, which may be between 40 and 80 microns in thickness. In another example the pre-formed dielectric sheet or tape is a dry film resist.

In a yet another example the pre-formed dielectric sheet or tape is a laminating sheet applied to the wafer to hold the wafer for a dicing process. In this example the method further comprises dicing the wafer into individual integrated isolator circuit structures after the application of the pre-formed dielectric sheet but before the formation of the second electrode set. In this way, the sheet has two purposes—it holds the wafer in place for dicing, and then after dicing it forms part of the circuit structure being fabricated on the wafer, in the form of the isolation layer.

In many examples of the disclosure the isolator circuit structure is a digital isolator circuit structure, similar, for example, to those forming part of the iCoupler™ family of digital couplers available from Analog Devices, Inc.

From another aspect, the present disclosure also describes a method of fabricating an integrated digital isolator circuit, comprising forming a first electrode set on an integrated circuit wafer substrate, and rolling a pre-formed sheet or tape of dielectric material having a predetermined thickness to give a predetermined electrical isolation property over the first electrode set. A second electrode set is then formed on the pre-formed sheet or tape of dielectric material to give the digital isolator structure.

In one example, as part of the completed structure a first passivation layer is formed over the first electrode set prior to the rolling of the pre-formed sheet or tape, the first passivation layer having vias formed therein to permit electrical contact to be made with at least part of the first electrode set, and a second passivation layer is formed over the second electrode set, the second passivation layer having vias formed therein to permit electrical contact to be made with at least part of the second electrode set.

In one example the first and second electrode sets comprise respective conducting coil structures that in use magnetically couple as the coils of a transformer, whereas in another example the first and second electrode sets comprise respective conducting plate structures that in use capacitively couple as the plates of a capacitor. Hence, examples of the disclosure provide isolators that operate both magnetically and capacitively.

In some examples the pre-formed sheet or tape is made of a material selected from the group comprising: i) polyimide; or ii) dry-film resist. Polyimide in particular provides good isolation properties, but with conventional techniques requires multiple spin-coating and curing steps to build up suitable thick layers. With examples of the present disclosure such thick polyimide layers can be provided with a single processing step of applying the pre-formed film In a further example there is also provided an integrated isolator circuit structure, comprising a first electrode set formed on a substrate wafer, a pre-formed dielectric sheet or tape applied over the first electrode set, and a second electrode set formed on the applied pre-formed dielectric sheet or tape. In this respect, the pre-formed dielectric sheet or tape is a single homogenous layer of a predefined thickness which is pre-formed in the single layer of the predefined thickness and applied over the first electrode set in a single processing step.

Further features, examples, and advantages of the present disclosure will be apparent from the following description and from the appended claims.

BRIEF DESCRIPTION OF THE DRAWINGS

Examples of the present disclosure will now be described with reference to the accompanying drawings, wherein like reference numerals refer to like parts, and wherein:

FIG. 9 is a flow diagram illustrating the processing steps involved to create a digital isolator structure according to examples of this disclosure.

DETAILED DESCRIPTION

Integrated digital isolators comprise a first transformer coil or capacitor plate mounted on an integrated circuit substrate, and separated from a second transformer coil or capacitor plate via an electrically insulating isolation layer. Information may be transferred across the isolation layer via magnetic or electric field, depending on whether an inductive coil or capacitive plate arrangement is used. Data encoding and decoding protocols may be used to encode and decode the information passed across the isolation layer to allow for more rapid data transmission. The electrical isolation that is achieved is dependent upon the material and thickness of the isolation layer. Thick isolation layers in the past have been produced by spin-coating polyimide or similar materials onto the substrate bearing the first transformer coil or capacitor, or by depositing thick layers of silicon dioxide (SiO2) or silicon nitride (SiN). However, in order for thick enough layers to be deposited a relatively large amount of fabrication time is required, and multiple processing steps involved. For example, when using polyimide up to three separate spin-coating and curing stages may need to be performed, to achieve the desired polyimide layer thickness. Such multiple processing steps also carries the risk of outgassing during the multiple curing processes which in turn can cause bubbles to form in the layers, thus reducing the yield. In order to reduce the amount of time required for fabrication whilst still allowing thick isolation layers to be deployed, therefore, in examples of the disclosure pre-formed sheets or tapes of dielectric material are applied to the substrate over the first transformer coil or capacitive plate, for example by being rolled onto the substrate using a heated roller, or applied directly over the whole surface within a vacuum. Such techniques result in a thick isolation layer that is formed using a simple one-step process, and hence much more quickly and with lower outgassing risk than conventional spin-coating or deposition techniques.

Examples of the present disclosure will now be described with respect to the accompanying Figures.

Figure 1:
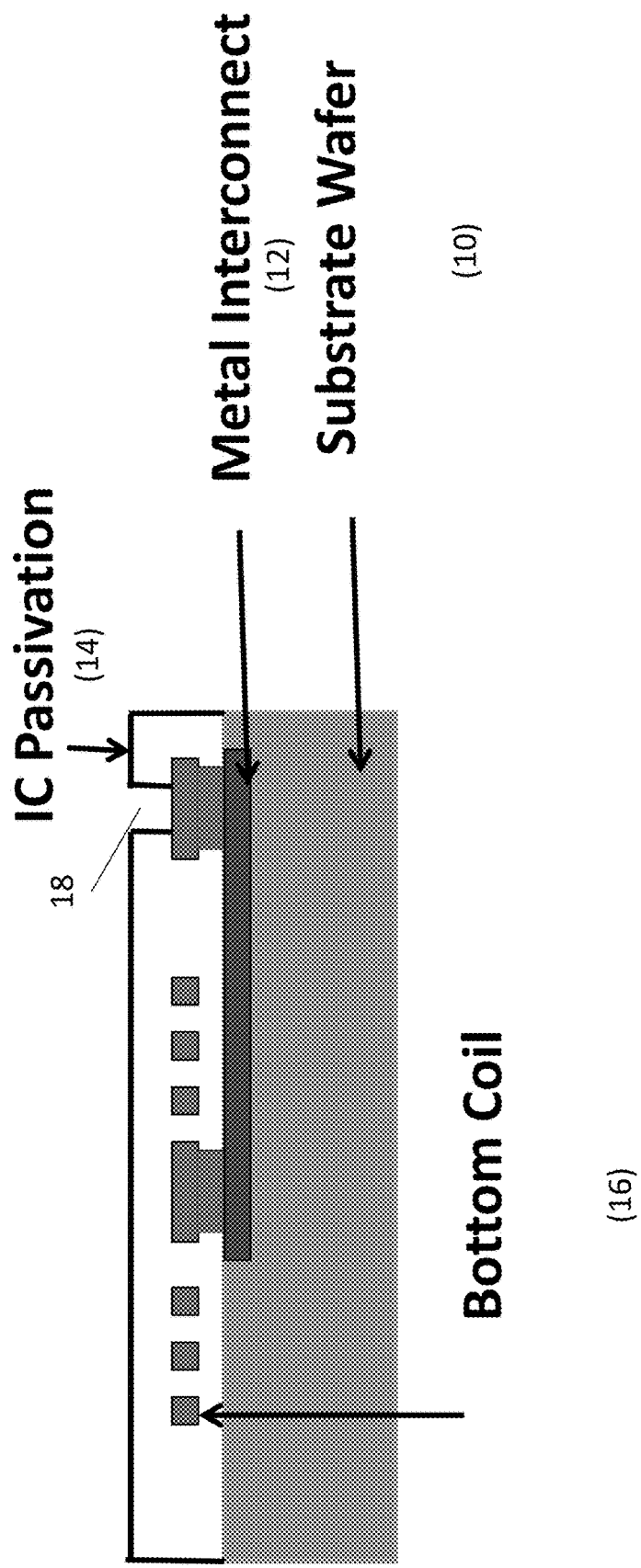
FIG. 1 is a diagram of part of a digital isolator structure forming the basis for an example of this disclosure.
Figure 2:
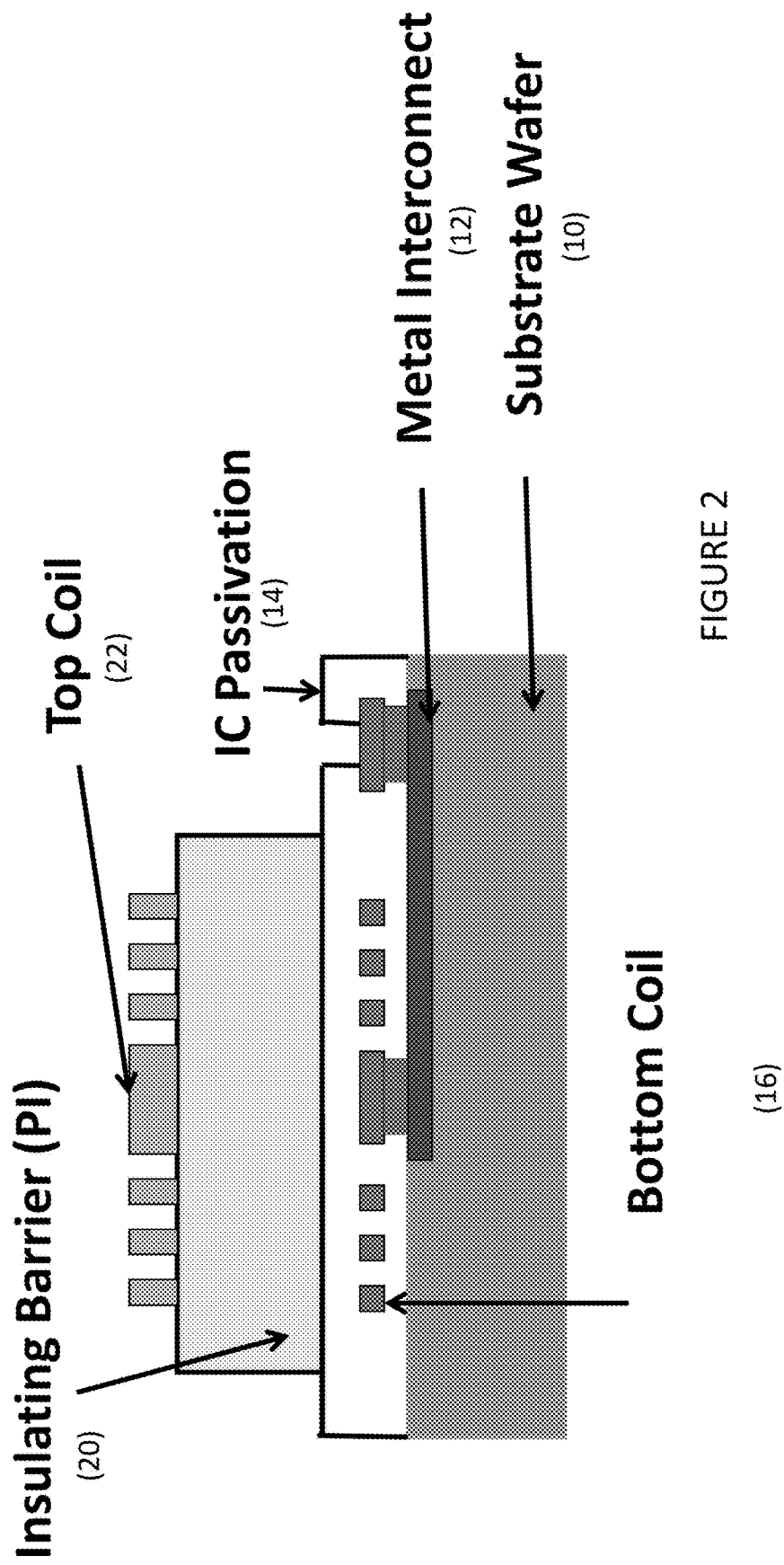
FIG. 2 is a diagram of the digital isolator structure of FIG. 1 after additional processing.
Figure 3:
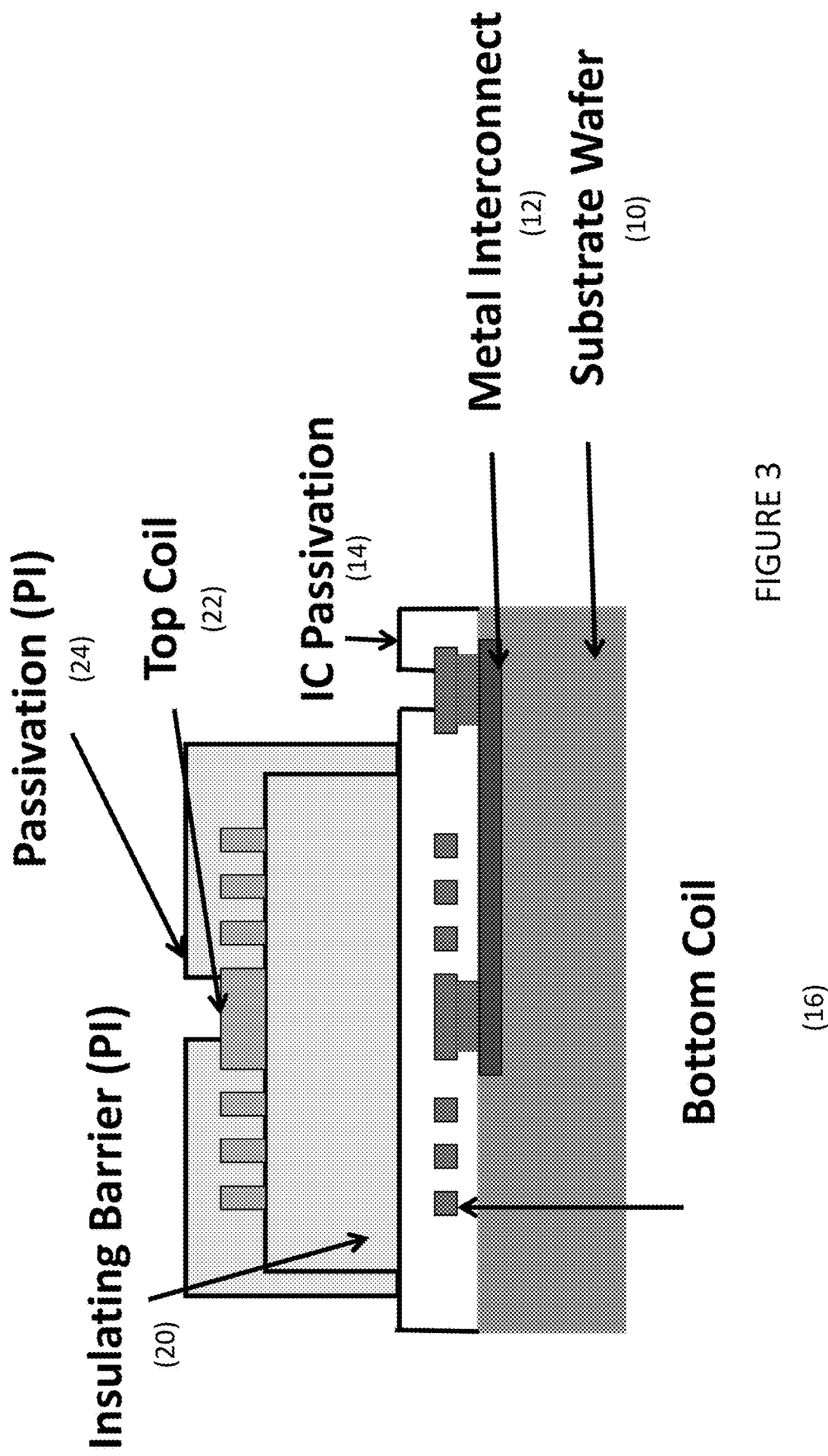
FIG. 3 is a diagram of the digital isolator structure of FIG. 2 after further processing steps.

FIGS. 1, 2, and 3 illustrate example digital isolator structures in various stages of fabrication, described here to provide background context to the present examples. FIG. 1 shows a first bottom coil 16 that forms one half of an isolator data transfer structure formed on a substrate wafer 10 that may contain other integrated circuits—in all embodiments substrate wafer 10 may contain integrated circuits—for example to provide drive signals to the digital isolator. The bottom coil 16, which would typically by a conductive spiral coil formed on the surface of the substrate, has a metal interconnect 12 extending from its central hub over the surface of the substrate 10 to a contact formed under a via 18. A passivation layer 14 is formed over the bottom coil 16, with the via 18 being formed within the passivation layer, through to the contact with the metal interconnect 12 thereunder. The bottom coil 16 may be aluminum or other metallization.

In order to provide suitable isolation an insulating barrier 20 formed from suitable dielectric material is formed on top of the passivation layer 14, as shown in FIG. 2. This insulating barrier may typically be spin-coated polyimide, or deposited silicon nitride or silicon dioxide. Formed on top of the insulating barrier 20 is a top conducting coil 22 that forms the other half of the digital isolator data transfer structure. As shown in FIG. 3, a passivation layer 24 may then be formed over the top coil 22, leaving a via therein to allow access to the center node of the top coil, to act as an input and output node for the top coil. The addition of the passivation layer 24 effectively gives the completed digital isolator structure; drive circuitry will typically be provided elsewhere, for example in the substrate wafer.

In operation the digital isolator magnetically couples data across the isolation barrier 20, using the respective top and bottom coils 22 and 16 as either primary and secondary coils respectively of a transformer, depending on the direction of data transmission. Data encoding and decoding circuitry (not shown) is provided to allow for more rapid data transmission and the ability to handle complex, bidirectional interfaces, such as USB and I²C. One encoding method used is an on/off keying (OOK) technique that encodes rising and falling edges as double or single pulses that drive the transformer coil on the primary side. These pulses are decoded back into rising and falling edges on the transformer secondary side. Such a technique reduces power consumption by 10 to 100 times compared to optocouplers, because power is not continuously applied. Another encoding method involves modulating an RF signal with the data, the modulated RF signal then being applied to the primary coil of the transformer. Whilst effective, this uses more power than the OOK pulsed technique because logic HIGH signals typically result in continuous RF transmission (although this does depend on the RF modulation scheme used).

As discussed previously, although shown in FIGS. 1 to 3 as coils 16 and 23 of a magnetically coupled transformer, in other examples the coils 16 and 23 may be replaced by respective capacitive plates, to provide for electrical coupling and data transfer therebetween. Hence, in the examples described herein the coils of the digital isolator may be replaced by respective capacitive plates, if operation using electric field is required.

The present disclosure relates to the method of formation of the insulating barrier 20, and to a device formed by the method. The overall method provided by an example of the disclosure is shown in FIG. 9, wherein a device structure such as that shown in FIG. 1 and described above is first fabricated at steps S.9.2, and S.9.4, as described above. This then gives an intermediate device structure as shown in FIG. 1, over which the insulating barrier layer 20 then needs to be formed in accordance with the examples to be described below.

Figure 4A:
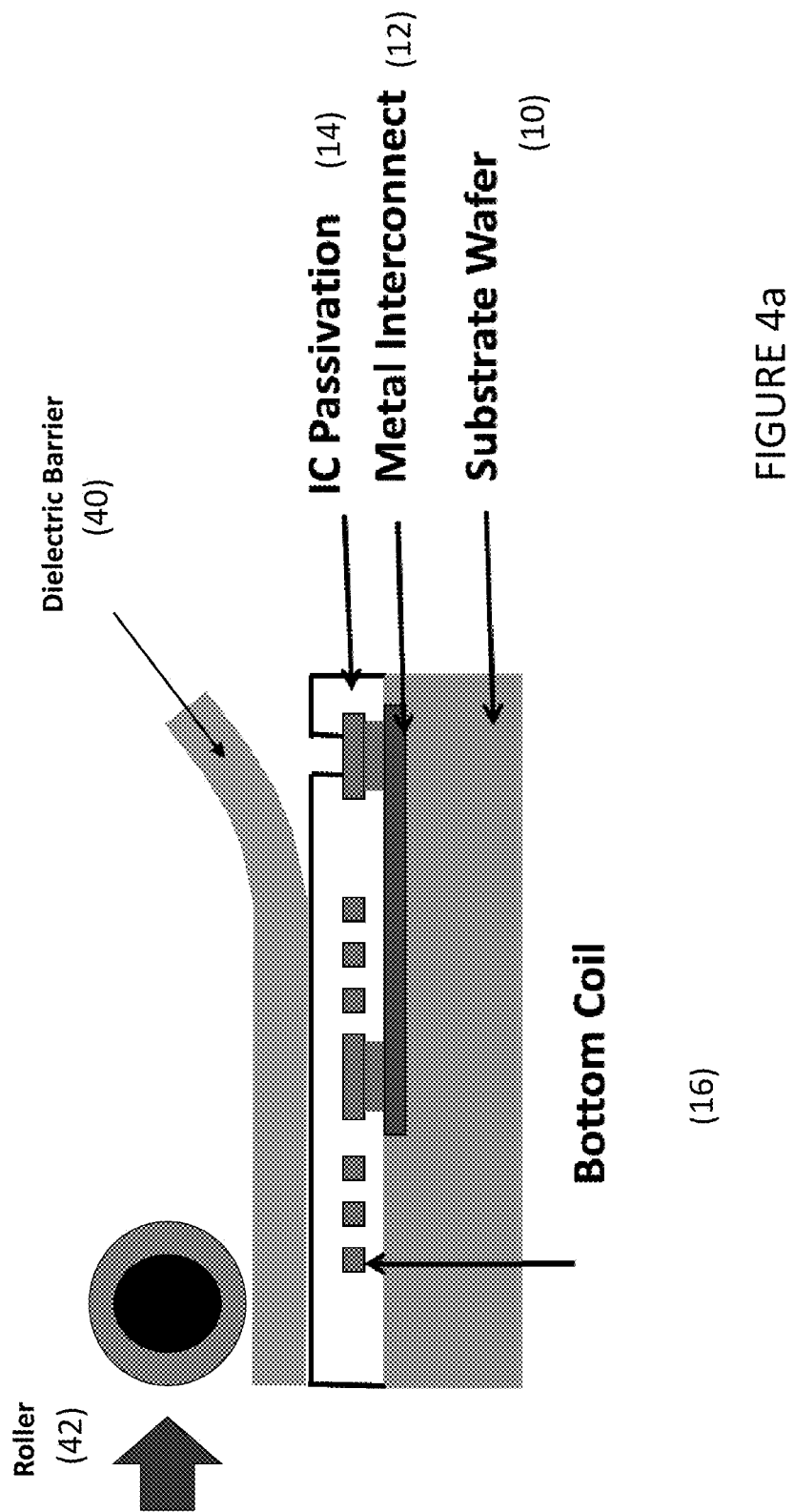
FIG. 4a is a diagram of a digital isolator structure undergoing a processing step according to an example of this disclosure.
Figure 4B:
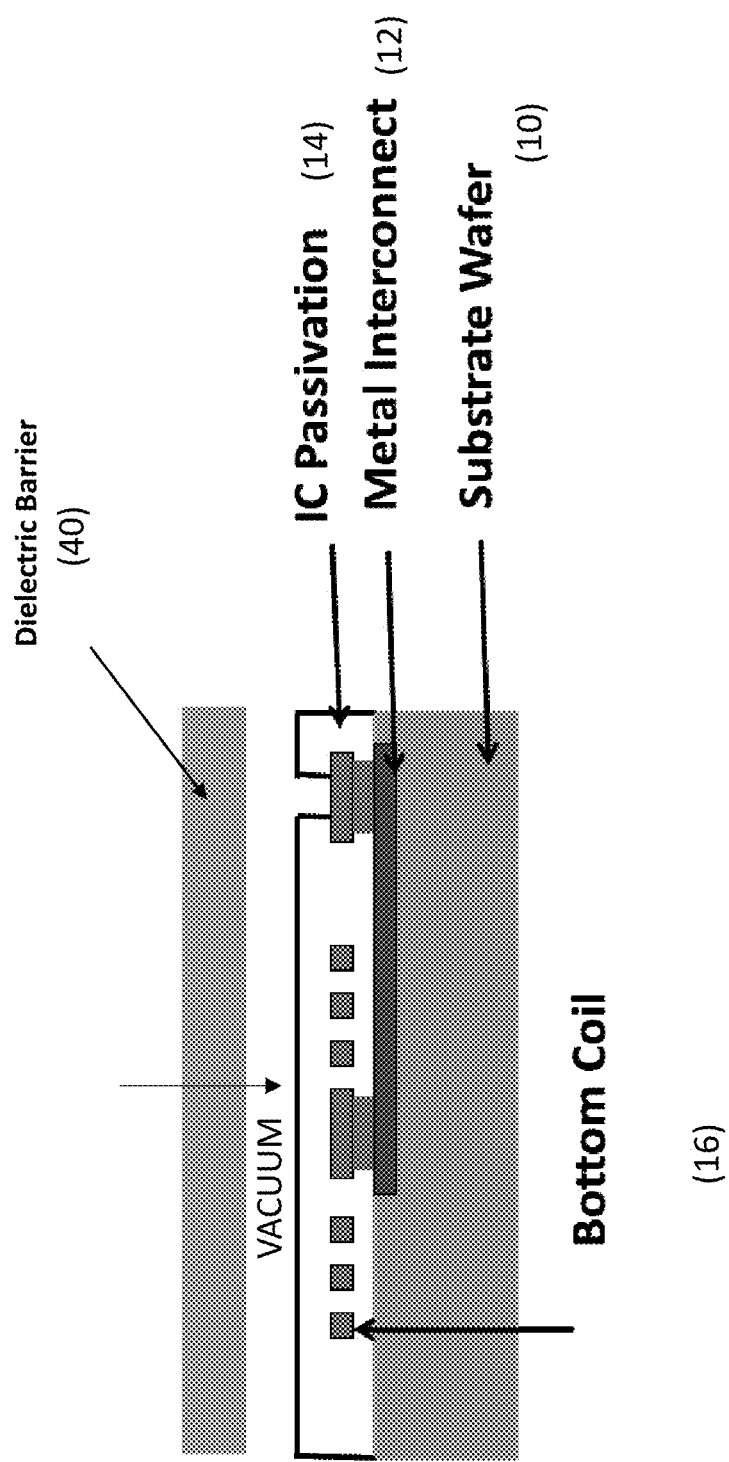
FIG. 4b is a diagram of a digital isolator structure undergoing a processing step according to an alternative example of this disclosure.

Moving now to FIGS. 4*a* and 4*b*, as noted above, one of the problems with forming the insulating barrier 20 using conventional spin-coating of polyimide, or deposition of SiN or SiO2 is that it can take a great deal of time to build up thick enough insulating barriers to give the isolation properties required. In particular, building up thick layers of spin-coated polyimide requires multiple spin-coating and curing processes repeated in turn, often up to three times to achieve a 60 micron layer. These repeated processing steps in turn can result in outgassing problems in the spin-coated polyimide layers during subsequent heating of the respective layers for curing, resulting in bubbles forming in the layers, which reduces the electrical isolation obtained, and can cause lifting and peeling of the layers. As a consequence, manufacturing throughput of the isolator structures is reduced, and cost increased. In order to address this issue, therefore, in examples of the present disclosure a thick preformed tape or sheet of dielectric material is provided, which is then applied to the device, for example by being rolled thereon, or applied directly thereto in a vacuum, in a single step. In this way, a thick isolation layer can be provided in a single processing step, without the problems described above relating to the formation of multiple layers of spin-coated polyimide.

FIGS. 4*a* and 4*b* show such alternative fabrication steps (s.9.6). With reference to FIG. 4*a* first, a preformed sheet or tape 40 of dielectric material of the desired layer thickness is provided, and is applied to the upper surface of the passivation layer 14. In this example the sheet or tape is applied in a single step, by being rolled onto the wafer substrate from one side to the other. A roller tool 42, which may be a heated roller tool, may then be applied either after initial application of the tape or sheet, or at the same time as the sheet or tape is applied to the wafer, in order to ensure that the sheet or tape is uniformly applied to the wafer, and that no bubbles form under the sheet or tape 40. In this example, by being rolled on to the wafer, we mean that the pre-formed sheet or tape that is applied is first brought into contact with the wafer surface at one side of the wafer, and then contact between the sheet or tape and the surface of the wafer is then progressive across the wafer surface as the sheet or tape is lowered onto the wafer surface from one side of the wafer to the other. With such a fabrication step a dielectric barrier 40 is formed that can act as the insulating barrier 20 in a digital isolator, with the formation taking place in a single step. In addition, because the sheet or tape can be pre-formed to the desired thickness of isolation layer, for example, in the range of 40 to 80 microns, typically, the outgassing problems mentioned above relating to the alternating spin coating and curing of successive polyimide layers can be avoided.

FIG. 4*b* shows an alternative example of forming the thick dielectric layer. Here the dielectric sheet or tape 40 is applied directly to the passivation layer by being placed thereover so that it contacts the whole surface thereof at substantially the same time. In order to ensure that no air bubbles get trapped beneath the dielectric sheet with such an operation, the operation is performed within a vacuum environment. This ensures that no air or other gas bubbles can be trapped beneath the dielectric sheet when it is lowered on to the passivation layer. Moreover, provided the sheet or tape 40 is kept under sufficient tension as it is lowered onto the passivation layer, neither will any wrinkles or folds in the layer either be formed.

Figure 5:
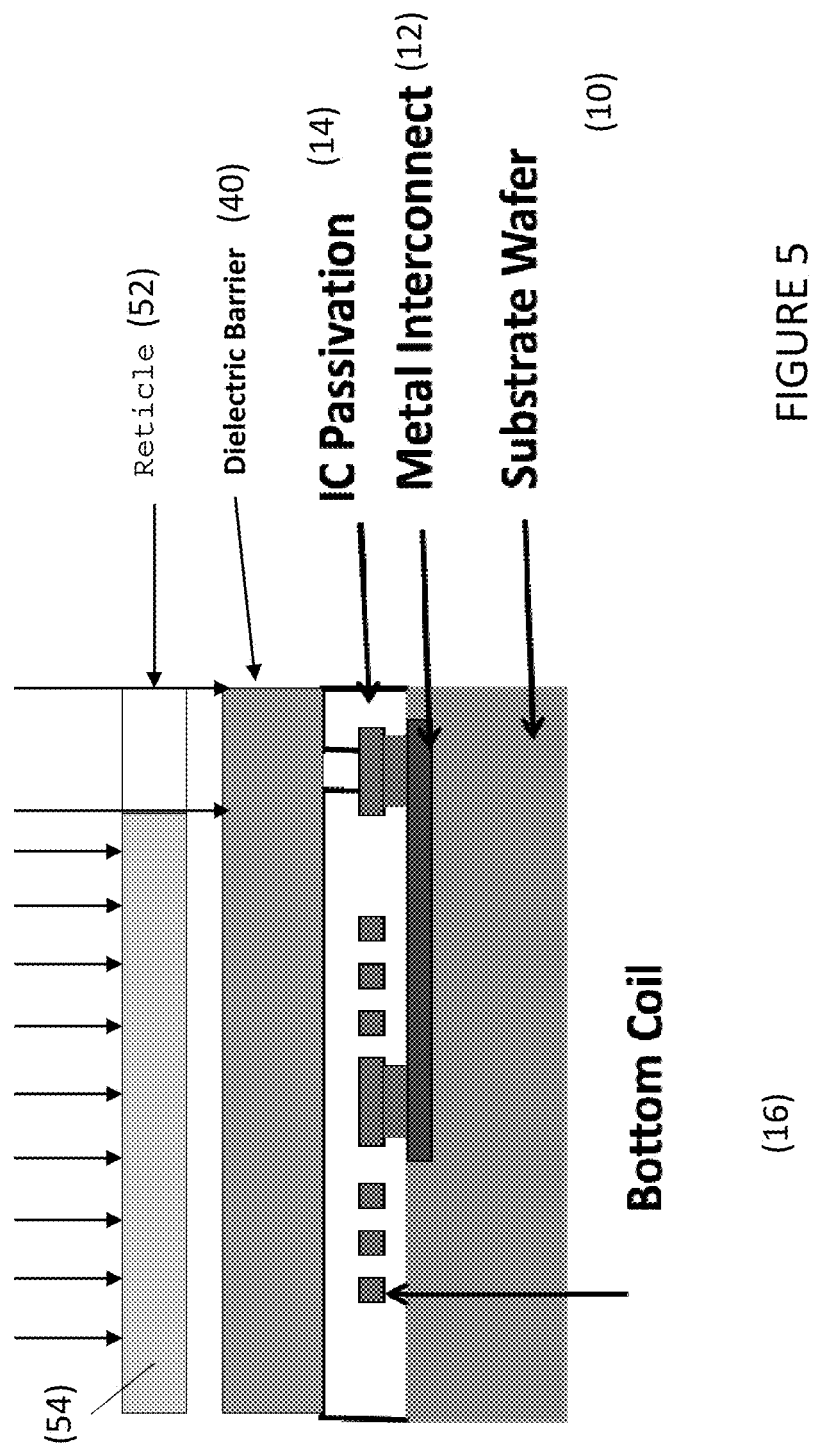
FIG. 5 is a diagram of a digital isolator structure undergoing a further processing step according to an example of the disclosure.
Figure 6:
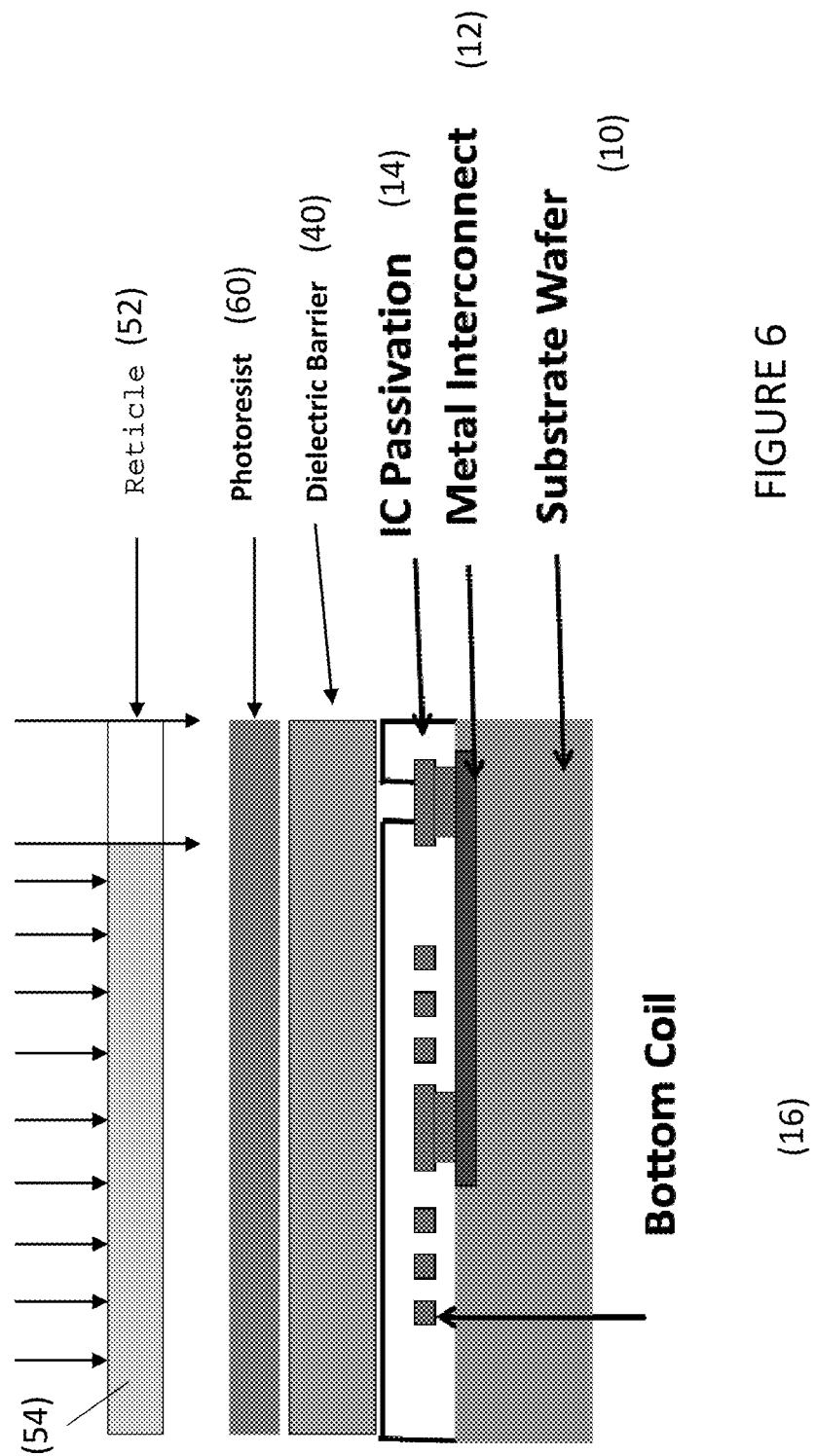
FIG. 6 is a diagram of a digital isolator structure undergoing an alternative further processing step to that of FIG. 5.

Once the dielectric barrier layer 40 has been rolled or lowered on to the wafer, it can then be patterned and any necessary vias formed therein for interconnects (s.9.8). Where the material of the dielectric barrier is photosensitive, it may be patterned directly using an appropriate die provided with appropriately positioned reticles 52 to define the desired via position, as shown in FIG. 5. Alternatively, if the dielectric barrier 40 is not photosensitive, a layer of photoresist 60 may be deposited on top of the barrier 40, which is then patterned appropriately to define the via location. In either case, the dielectric barrier may then be etched to from the necessary via 18 to allow connection to the bottom coil 16.

Figure 7:
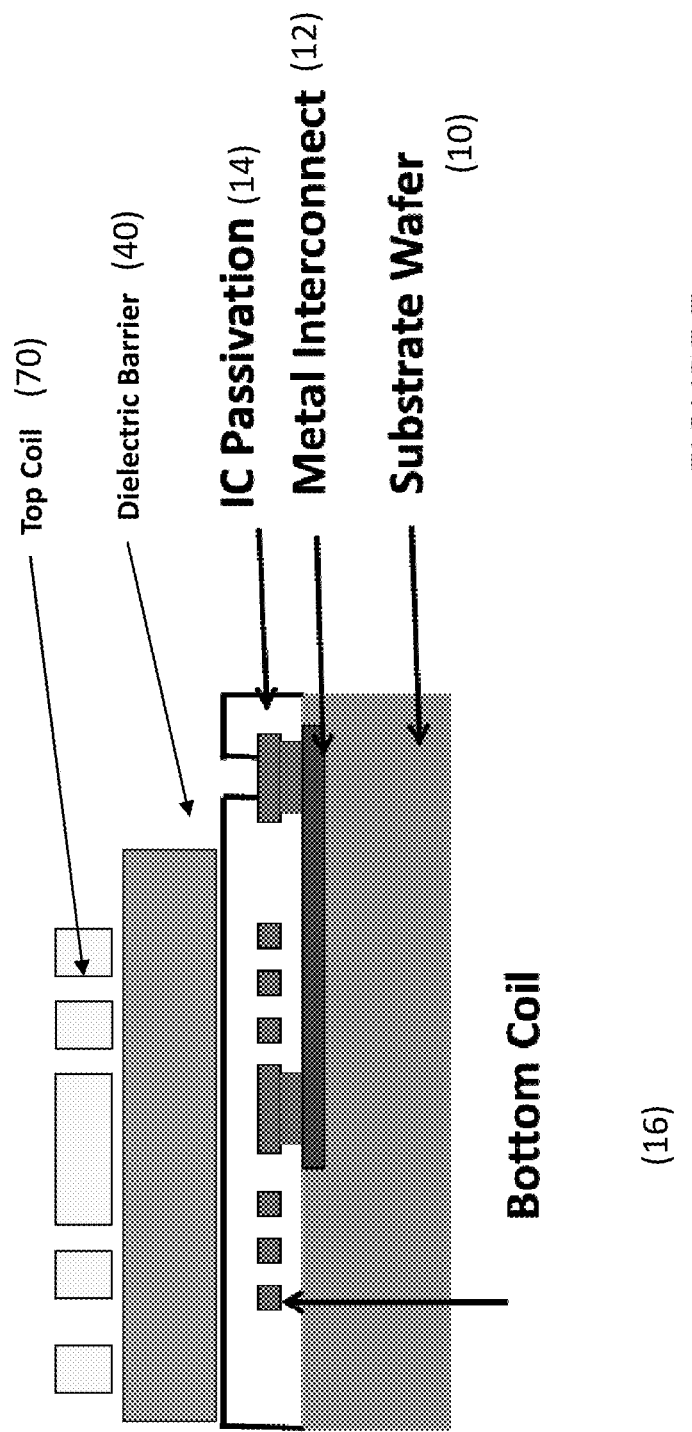
FIG. 7 is a diagram of a digital isolator structure after a further processing step.
Figure 8:
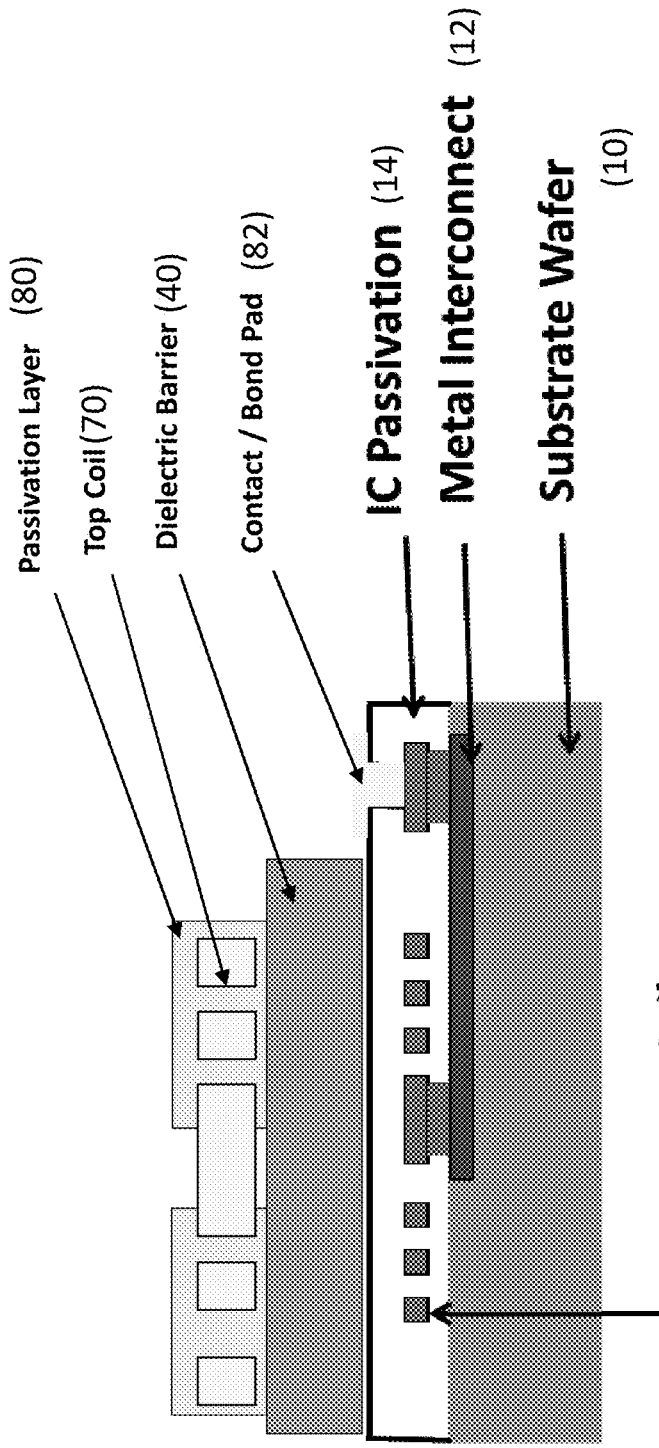
FIG. 8 is a diagram of a digital isolator structure after a yet further processing step.

Once the dielectric barrier 40 has been patterned and etched, further patterning and deposition of a metallization layer can occur, in order to form the top transformer coil 70 of the isolator, as shown in FIG. 7 (s.9.10). A second passivation layer 80 is then formed over the top coil 70 (s.9.12), having a via formed therein (s.9.14) to allow access to an input and output electrode of the coil, to allow data signals to be fed to and obtained therefrom. The provision of the second passivation layer effectively completes the fabrication of the isolator structure, but of course drive circuitry and other connections into the remainder of the IC would be required to provide a complete device. Such details are not necessary for and are beyond the scope of the present disclosure, however, which is concerned with the fabrication of the isolator structure, and particular the formation of the dielectric barrier layer 40.

In this regard, and returning to the formation of the dielectric barrier layer 40, as mentioned above, the layer is provided as a preformed sheet or tape, which is then applied to the wafer in a single processing step, for example by being rolled onto the wafer from one side to the other, or lowered thereon in a vacuum. The sheet or tape may be polyimide, of, for example 40 to 80 microns thickness, although in other examples any other dielectric material may be used, for example any dielectric polymer material, such as an organic polymer. The preformed sheet or tape is provided to the fabrication process in the desired thickness required for the barrier layer 40, so that no further significant processing steps are required other than to apply the sheet or tape in order to form the barrier layer 40.

In one example the sheet can be a laminated polyimide sheet which is used as a support structure for the wafer when the wafer is diced into individual chips. In this regard, the polyimide support sheet would be applied to the wafer after the processing of s.9.4 to form the passivation layer over the bottom coil, the wafer would then be diced into individual chips, and then the processing would continue as normal to pattern and etch the thus formed insulating layer on the diced chips. In this way, a further processing step is avoided in the whole digital isolator fabrication process.

In another example, instead of the dielectric barrier being a polyimide sheet, it may instead be a preformed sheet or tape of dry film resist, which is again rolled onto the substrate, for example with a hot roller. Metallization to form the top coil or plate of the isolator may then be performed on top of the barrier layer, whether it is dry-film resist or polyimide.

With the above examples, therefore, a method of forming an isolation layer in a digital isolator structure is provided that is able to form a thick isolation layer in fewer processing steps and with greater reliability by virtue of applying a pre-formed dielectric sheet or tape to the wafer as the isolation layer. The application may comprise rolling the preformed dielectric sheet or tape on to the wafer from one side to the other, and in some examples this may be assisted by a roller tool. In other examples the preformed dielectric sheet may be lowered onto the substrate directly, within a vacuum environment. The preformed sheet may be polyimide, for example of 40 to 80 microns thickness, dependent on the isolation required, although other dielectric polymer materials may also be used. In another example, a dry film resist may be used as the preformed sheet or tape that is applied.

Various further modifications, whether by way of addition, deletion, or substitution may be made to the above mentioned examples to provide further examples, any and all of which are intended to be encompassed by the appended claims.

What is claimed is:

1. A method of forming a dielectric insulation layer in an integrated isolator circuit, comprising:
   receiving a partially formed integrated isolator circuit structure having a first electrode set formed on a substrate wafer;
   applying a pre-formed dielectric sheet or tape over the partially formed integrated isolator circuit structure;
   depositing a metallization layer on the pre-formed dielectric sheet or tape; and
   patterning the metallization layer deposited on the pre-formed dielectric sheet or tape to form a second electrode set on the pre-formed dielectric sheet or tape.

2. A method according to claim 1, wherein applying the pre-formed dielectric sheet or tape comprises rolling the pre-formed dielectric sheet or tape onto the partially formed integrated isolator circuit structure from one side of the partially formed integrated isolator circuit structure to another.

3. A method according to claim 2, wherein rolling the pre-formed dielectric sheet or tape comprises rolling the pre-formed dielectric sheet or tape with the aid of a roller tool.

4. A method according to claim 1, wherein the pre-formed dielectric sheet or tape is a polymer material.

5. A method according to claim 4, wherein the pre-formed dielectric sheet or tape is a polyimide sheet or tape.

6. A method according to claim 5, wherein the polyimide sheet or tape is between 40 and 80 microns in thickness.

7. A method according to claim 1, wherein applying the pre-formed dielectric sheet or tape comprises applying the pre-formed dielectric sheet or tape onto a surface of the partially formed integrated isolator circuit structure substantially simultaneously across the surface, the application being performed in a vacuum environment sufficient to prevent formation of gas bubbles beneath the pre-formed dielectric sheet or tape as it is applied.

8. A method according to claim 1, wherein the pre-formed dielectric sheet or tape is a dry film resist.

9. A method according to claim 1, wherein the pre-formed dielectric sheet or tape is a laminating sheet, and wherein the method further comprises dicing the substrate wafer into individual integrated isolator circuit structures after the application of the pre-formed dielectric sheet or tape and before the depositing and the patterning of the metallization layer.

10. A method according to claim 1, wherein the integrated isolator circuit is a digital isolator circuit.

11. A method of fabricating an integrated digital isolator circuit, comprising:
    forming a first electrode set on an integrated circuit wafer substrate;
    rolling a pre-formed sheet or tape of dielectric material having a predetermined thickness to give a predetermined electrical isolation property over the first electrode set;
    depositing a metallization layer on the pre-formed sheet or tape of dielectric material; and
    patterning the metallization layer deposited on the pre-formed sheet or tape of dielectric material to form a second electrode set on the pre-formed sheet or tape of dielectric material.

12. A method according to claim 11, further comprising forming a first passivation layer over the first electrode set prior to the rolling of the pre-formed sheet or tape, the first passivation layer having vias formed therein electrically contacting at least part of the first electrode set.

13. A method according to claim 12, further comprising forming a second passivation layer over the second electrode set, the second passivation layer having vias formed therein electrically contacting at least part of the second electrode set.

14. A method according to claim 11, wherein the first and second electrode sets comprise respective conducting coil structures forming a transformer.

15. A method according to claim 11, wherein the first and second electrode sets comprise respective conducting capacitor plates.

16. A method according to claim 11, wherein the pre-formed sheet or tape comprises polyimide or dry-film resist.

17. A method of fabricating an integrated digital isolator circuit, comprising:
    applying a dielectric sheet or tape having a predetermined thickness over a first electrode formed on a wafer substrate;
    depositing a metallization layer on the dielectric sheet or tape; and
    patterning the metallization layer deposited on the dielectric sheet or tape to form a second electrode on the dielectric sheet or tape.

18. The method of claim 17, wherein the dielectric sheet or tape has a substantially uniform thickness.

19. The method of claim 17, wherein the applying the dielectric sheet or tape is performed in a vacuum environment that prevents formation of air or gas bubbles beneath the dielectric sheet or tape.

20. The method of claim 17, wherein the dielectric sheet or tape applied over the first electrode is substantially devoid of wrinkles or folds.

* * * * *